(12) United States Patent
Anderson et al.

(10) Patent No.: US 7,524,537 B2
(45) Date of Patent: Apr. 28, 2009

(54) SPRAY COATING APPARATUS AND FIXTURES

(75) Inventors: Curtis Wayne Anderson, Mesa, AZ (US); Lenard Reeves, Gilbert, AZ (US); Bjarne Heggli, Scottsdale, AZ (US); Thomas William Dowland, Jr., Fountain Valley, CA (US)

(73) Assignee: White Electronic Designs Corporation, Phoenix, AZ (US)

( * ) Notice: Subject to any disclaimer, the term of this patent is extended or adjusted under 35 U.S.C. 154(b) by 0 days.

(21) Appl. No.: 10/845,746

(22) Filed: May 13, 2004

(65) Prior Publication Data

US 2004/0209001 A1 Oct. 21, 2004

Related U.S. Application Data

(62) Division of application No. 10/339,800, filed on Jan. 10, 2003, now Pat. No. 7,208,046.

(51) Int. Cl.
*B05D 1/32* (2006.01)
*C23C 4/00* (2006.01)
*C23C 4/02* (2006.01)

(52) U.S. Cl. ................. 427/448; 427/446; 118/302; 118/500; 118/503; 118/504; 118/505

(58) Field of Classification Search ............... 427/448
See application file for complete search history.

(56) References Cited

U.S. PATENT DOCUMENTS

| 3,678,892 | A | * | 7/1972 | Fairchild | .............. 118/504 |
| 4,485,759 | A | * | 12/1984 | Brandolf | ............... 118/503 |
| 5,691,018 | A | * | 11/1997 | Kelley et al. | ............ 428/36.8 |
| 5,762,711 | A | * | 6/1998 | Heffner et al. | ............ 118/302 |
| 5,877,093 | A | | 3/1999 | Heffner et al. | |
| 5,911,830 | A | * | 6/1999 | Chakrabarti et al. | ........ 118/503 |
| 6,110,537 | A | | 8/2000 | Heffner et al. | |
| 6,162,335 | A | * | 12/2000 | Jordan et al. | ......... 204/297.01 |
| 2002/0172769 | A1 | * | 11/2002 | Herber et al. | ............. 427/271 |

* cited by examiner

*Primary Examiner*—Katherine A Bareford
(74) *Attorney, Agent, or Firm*—Allen J. Moss; Alex Starkovich; Squire, Sanders & Dempsey LLP (57) ABSTRACT

A system for applying a sprayed coating includes a spray mechanism operative to spray a liquefied coating material; a target system including a rotatable spray target wheel; and one or more device-holding fixtures configured to be mounted onto the spray target wheel without requiring either an unattached threaded fastener or a locking pin. Preferred embodiments of the system are configured for thermal spray application of Tamper Resistant Coatings (TRCs).

4 Claims, 12 Drawing Sheets

SPRAY COATING APPARATUS AND FIXTURES

This application is a divisional application of and claims priority to U.S. patent application Ser. No. 10/339,800, filed Jan. 10, 2003, now U.S. Pat. No. 7,208,046, by Curtis W. Anderson, Thomas W. Dowland, Leonard W. Reeves, and Bjarne Heggli.

BACKGROUND OF THE INVENTION

1. Technical Field

The present invention is related to devices and fixtures for coating objects with a sprayed material. More paritcularly, but no exclusively, the invention relates to devices and methods for thermal spray processes.

2. Background Art

There are many applications in which it is desired to apply a coating to a part or form a product layer using a spray process. Such applications may include applying primers, paints, and/or other types of coatings. Once such coating for which the present invention may used, but is not limited to, is the application of a tamper resistant coating (TRC). A TRC is a layer applied to a product to provide a physical barrier to prevent inspection of, and tampering with, for example, the underlying circuitry and contents of electronic components.

Processes and systems for coating electronic circuits with protective coatings and security coatings using a thermal spray are generally known. Examples of such processes are described in U.S. Pat. Nos. 5,877,093; 6,110,537; 5,762,711; and 6,319,740 all to Heffner et al. Application of TRCs by heating a material to a molten state and spraying the molten material where desired, is referred to herein as a "thermal spray" or "molten spray" process."

Figure 1:
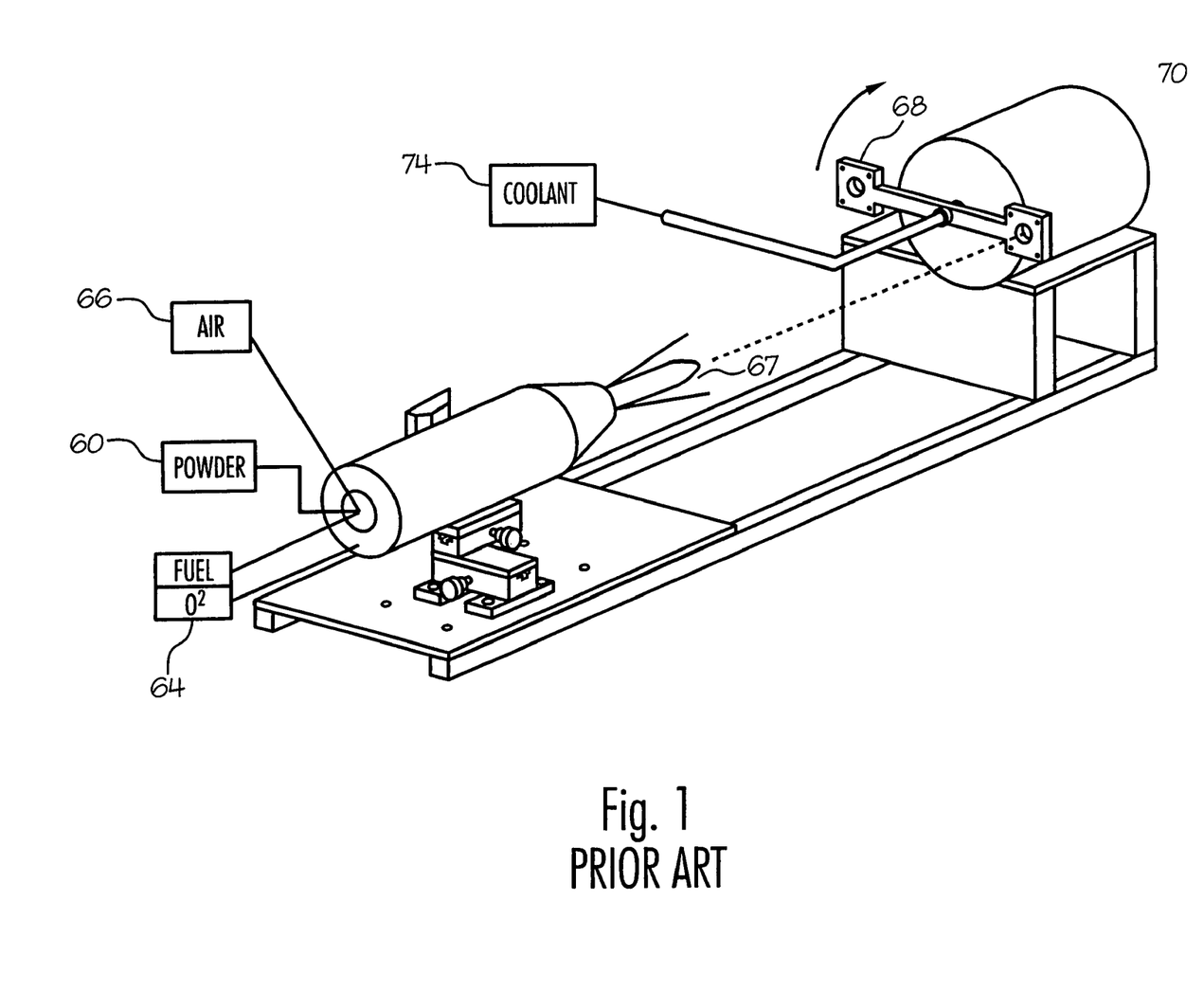
FIG. 1 is a thermal spray system of the prior art.

FIG. 1 illustrates a thermal spray system disclosed by U.S. Pat. No. 6,110,537 to Heffner et al., which is incorporated herein by its reference. Particles of a coating material 60 are supplied from a feedstock supply to a thermal spray gun 31. Fuel and oxygen are supplied to gun 31 to heat the coating material 60 to a molten state. Air 66 is combined with the stream of molten particles and output through flame front 67 toward one or more parts or circuits mounted on arms 68. During the thermal spray process, arms 68 are rotated by motor 70. A coolant 74 may be pumped through the interior of arms 68 to regulate temperatures during the thermal spray process.

Arms 68 rotate at in the range of approximately one thousand revolutions per minute to repetitively sweep parts or circuits, e.g. attached at ends of arms 68, through the flame spray. With each pass, a layer of coating builds up on the exposed surface of an integrated circuit.

Figure 2:
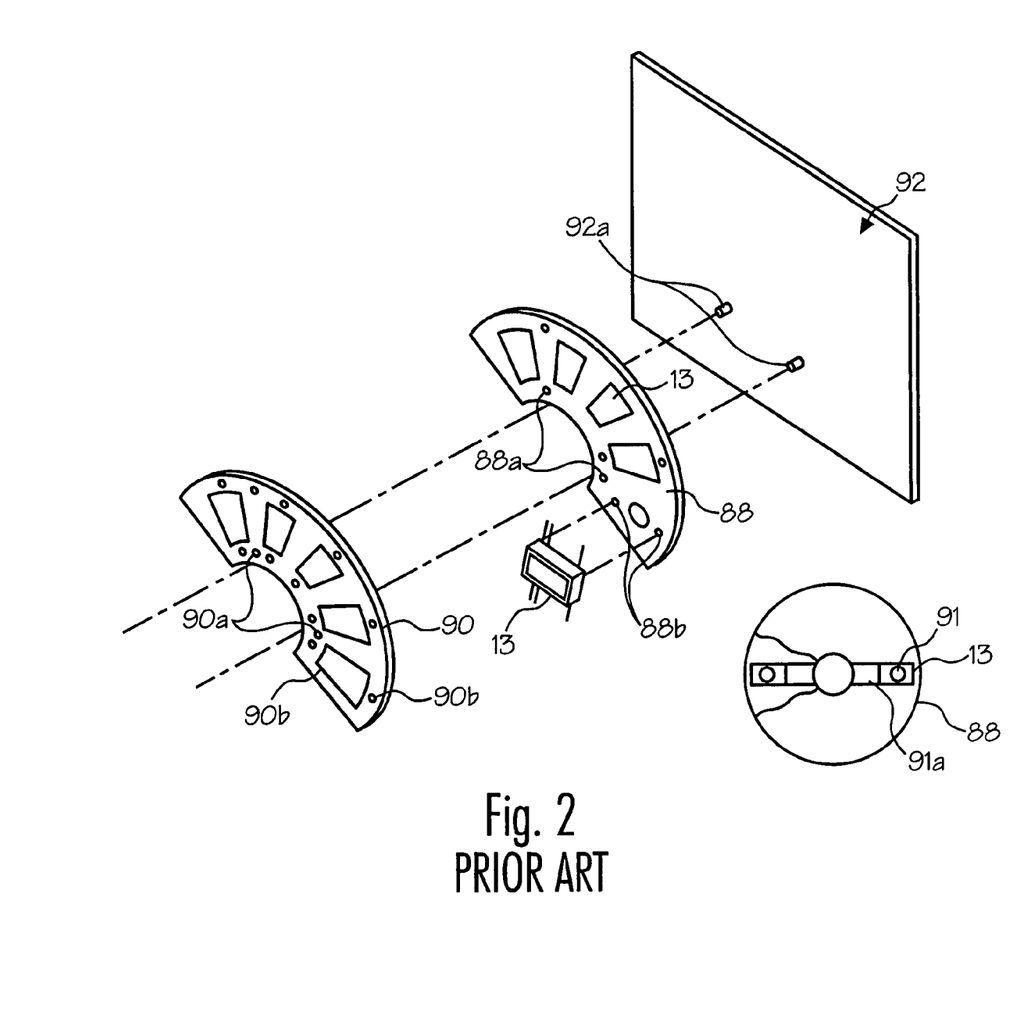
FIG. 2 is modified thermal spray system of the prior art.

As shown in FIG. 2, U.S. Pat. No. 6,110,537 to Heffner et al. also discloses an embodiment wherein in lieu of arms 68, multiple integrated circuits 13 may be clamped in an aluminum disk fixture including disk 88 and mask 90 to a stand 92 having alignment pins 92a. Integrated circuits 13 are inserted and individually clamped in place by screws (not shown) that are inserted in holes 88b and 90a. Like arm 68 disk 88 contains internal coolant outlets 91 that connect with internal coolant passages 91a. The disk disclosed by Heffner et al. enables thermal spray processing of multiple ICs but requires a person to individually insert each circuit 13 in the disk before performing the thermal spray process. Furthermore, each circuit must be individually removed from the disk by hand before further processing can be performed, if any is required.

The disk approach disclosed by Heffner et al. has subsequently evolved into the use of larger wheels and device holding structures mounted thereto. With a larger wheel, a plurality of device-holding fixtures can be mounted and processed. Further, spray guns mounted on movable arms were incorporated to cover the increasing spray area on the larger spray target wheels.

Placement of parts in fixtures along a circumference of a wheel maximized cooling efficiently at the expense of coating efficiency. Much of the area in the circumference of the spray area did not hold parts and thus coating material was wasted and throughput limited. Attempts were then made to fill in empty spaces of the wheel to improve coating efficiency. However, these wheels and accompanying device (IC) holding fixture designs had significant disadvantages.

One disadvantage of early device-holding fixtures was that they were large and difficult to mount to the spray wheel; particularly for fixtures that may have warped through normal and continuous use. In the past, fixtures were typically mounted by placing the fixture over shoulder bolts attached to the wheel, sliding the fixture to align mounting holes and inserting a lock pin. This mounting operation often proved difficult due to misalignments between the fixture and the wheel, and consequently, extraordinary measures were often required to insert the pin.

Another disadvantage of prior art systems is that the larger spray areas made it difficult to control the quality of the applied coatings. Because the thermal spray process is sensitive to the device substrate temperatures, a large spray area requires the torch to traverse a large area of the wheel and leads to a temperature gradient; often resulting in an undesirable variation of device coatings.

Additionally, the prior art thermal spray systems often use complicated cooling systems which increase overall costs. For example, incorporating coolant passages in the wheel and/or fixtures or using force-air cooling supplied from a compressed air source adds significant costs to the overall system and consequently, the devices fabricated using such a system.

Another problem of the prior art device-holding fixtures, e.g., 88, 90 FIG. 2, were that they were largely and oddly shaped to fit an arc or segment of a circular wheel. These custom shapes had two main problems: (i) the large pie-shaped segments did not lend themselves to pre or post coating automation steps since most automation equipment handle only regular shapes such as rectangles and squares; and (ii) the irregular shapes required additional or extravagant machining and wasted stock material. Both of these problems further increased the overall costs of the system and/or device fabrication.

Yet another problem with the prior art fixtures were that assembly the fixture assemblies required screws, bolts or other threaded fasteners that: (i) required significant operator time to assemble and disassemble; and (ii) exposed the devices to high risk from mishandled fasteners dropped onto the devices thus damaging die surfaces or wire bonds.

Lastly, the device-holding fixtures of the prior art were designed for hand placement of individual product into the fixture. The requirements of this labor-intensive process delays throughput and increases operating costs.

BRIEF SUMMARY OF THE INVENTION

At least one of the foregoing problems is overcome by providing a spray wheel configured to accommodate device-holding fixtures having a standard geometric shapes such as a rectangular or square shaped fixture. And preferably, these same fixtures are capable of being utilized in other processing steps. Additionally, the device-holding fixtures are configured to accommodate circuit handing trays or strips that hold multiple devices in each tray or strip to minimize handling of individual devices.

Repeatability and reliability of applying a TRC to parts is extremely important for processing multi-chip modues (MCMs) containing expensive ASICs (Application Specific Integrated Circuits). These modules are highly compact circuits having the functionality of several integrated circuits or a printed circuit board. Because of the high cost associated with these types of devices, parts are usually reworked rather than disposed of when found to be defective. This has conventionally limited their throughput due to the need to process these devices correctly the first time through. The features of the present invention enable more expensive types of MCMs to be coated in large batches that consistently meet quality control standards without requiring substantial reworking of parts.

Furthermore, a spray wheel of the present invention is configured for quick loading and unloading of device fixtures without requiring threaded fasteners or lock pins.

Yet another aspect of the invention includes a spray wheel design having a continuous metallic ring for monitoring substrate temperatures using non-contact infrared sensors.

Another aspect of the present invention includes a spray wheel having a spray surface free of all screws, bolts and other design features that may trap sprayed coating material to promote simpler removal of unwanted over-spray.

Yet a further aspect of the present invention includes a spray wheel and accompanying device-holding fixtures designed to coat provided parts in a thermal spray process without the need of forced cooling air or other coolants and able to maintain substantially uniform substrate temperatures, i.e., no significant difference between the inside and outside spray arcs.

Another aspect of the present invention is to provide a wheel-based spray coating system including a fixture mounting system for simplified addition/removal of device-holding fixtures to and from the wheel.

Yet a further aspect of the present invention includes a wheel-based coating system including a spray gun centering mechanism for machine alignment of a spray-coating gun to the wheel.

BRIEF DESCRIPTION OF THE SEVERAL VIEWS OF THE DRAWING

Further aspects, features and advantages of the present invention will become apparent from the following description of the invention in reference to the appended drawing in which like numerals denote like elements and in which.

DETAILED DESCRIPTION OF THE INVENTION

Figure 3A:
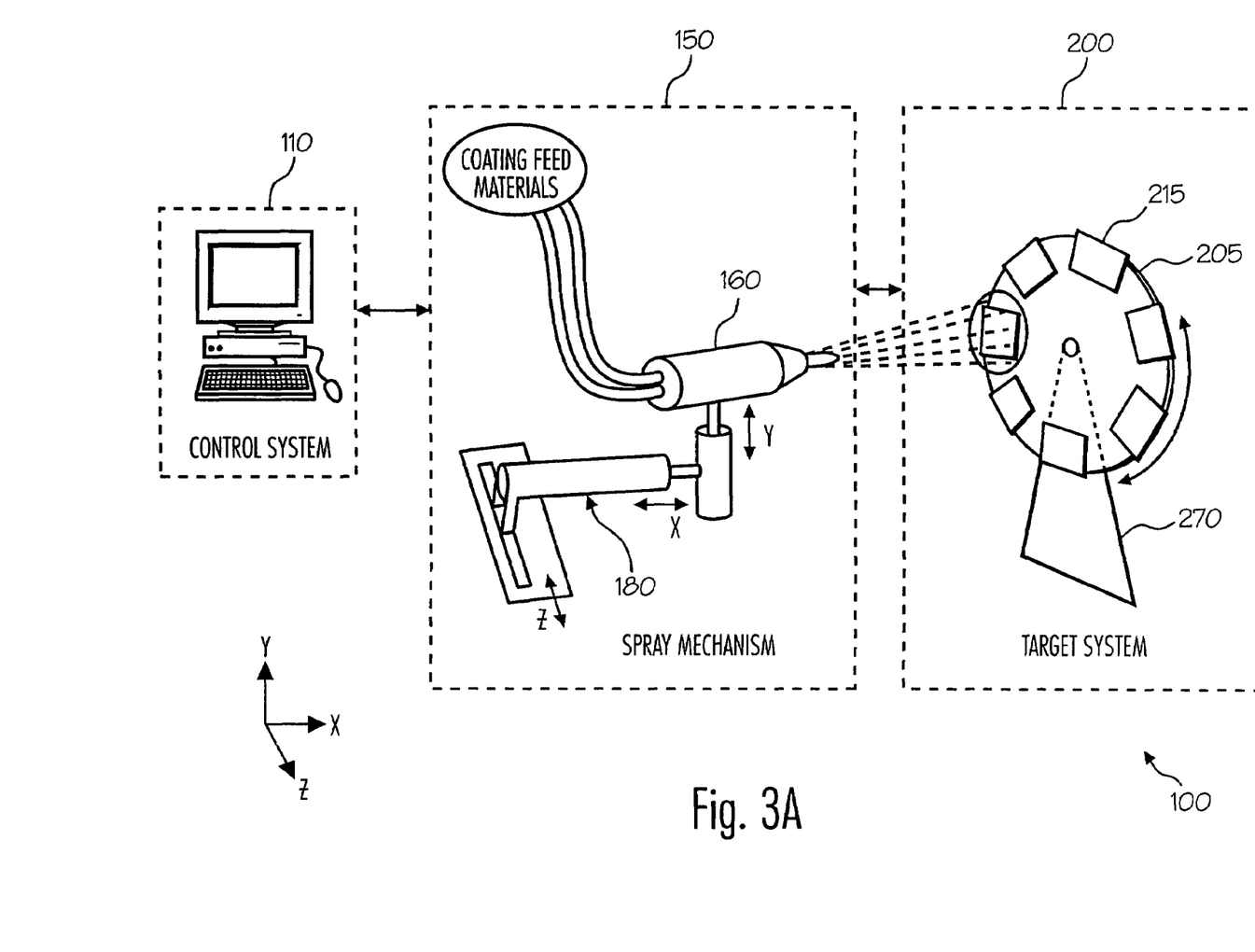
FIGS. 3A-3E illustrate a spray coating system and various components according to one embodiment of the present invention.

Turning to FIG. 3A, a coating system 100 for spray coating parts, according to one aspect of the invention includes a spray coating control system 110, a spray coating mechanism 150, and a spray target system 200.

Spray mechanism 150 functions to spray a coating material towards target system 200 to coat one or more devices with a coating. Spray mechanism 150 may be any device or combination of device for accomplishing this function. In preferred embodiments of the present invention, spray mechanism 150 comprises a thermal spray gun 160 similar to that disclosed by Heffner et al., and a spray gun mounting system 180. However, there is nothing herein that limits the present invention to thermal spray processes.

In the most preferred embodiments of the present invention, unlike the thermal spray system disclosed by Heffner et al., mounting system 180 is configured to be able to electrically, mechanically, and/or hydraulically move gun 160 in one or more directions. As shown by the example in FIG. 3A, spray gun 160 is mounted on mounting system 180 which may control the movement of gun 160 along any of the X, Y and/or Z axis for directing a spray of coating material toward target system 200. Mounting system 180 may further be configured to rotate spray gun 160 about the Y axis and/or angle gun 160 up or down from the X axis if desired. Mounting system 180 may be any device or combination of device suitable for these functions including one or more arms controlled by electric servos, hydraulic pumps, or mechanical gears.

Preferably, although not required, movement of mounting system 180 and/or the coating parameters of spray gun 160 are controlled using a computerized control system 110. Computerized control system 110 functions to convert user defined instructions into electrical signals for controlling various components of system 100 and may be any device or combination of devices for accomplishing this function including one or more computers, microprocessors, microcontrollers, programmable logic devices, and associated memories, cabling and/or peripheral components.

In preferred embodiments of the invention, control system 110 utilizes one or more computer programs to enable a user to set, maintain and/or adjust one or more coating parameters for coating parts. Such coating parameters may include, among others, the amount of coating material fed to and/or sprayed by gun 160, distance of gun 160 from target 200, movement of gun 160 during a coating run, revolutions per minute of target system 200, length of time for the spray processes, and, if a flame spray process, the mixture of the torch gases, temperature of sprayed coating, temperature of spray environment, and other user desired variations in spray coating.

Additionally, when a coating run for a particular product has already been designed, tested and accepted, the specific parameters used for applying that coating may be coded into machine-readable code for access by control system 110 to duplicate previously completed spray processes. This aspect of the present invention, along with others described herein, assists in facilitating repeatable batch processing of coated parts that consistently meet quality control standards.

Spray coating target system 200 serves to pass parts or products 215 through an airborne stream of coating material provided by spray mechanism 150. Target system 200 may be any device or combination of devices for accomplishing this purpose. In certain preferred embodiments, as described in further detail hereinafter, target system 200 includes a coating target wheel 205 rotatably mounted to a target wheel support structure 270. Parts or products 215 are attached to target wheel 205 and as target wheel 205 rotates about its axis, parts 215 are passed through the spray coating material.

Target wheel 205 and wheel support structure 270 may be any device or devices capable of accomplishing the foregoing functions. Notably, wheel support structure 270 may or may not include one or more electrically or mechanically motorized elements (not shown) for turning wheel 205; or alternatively, wheel 205 may be turned by a winding mechanism or by hand.

Figure 3B:
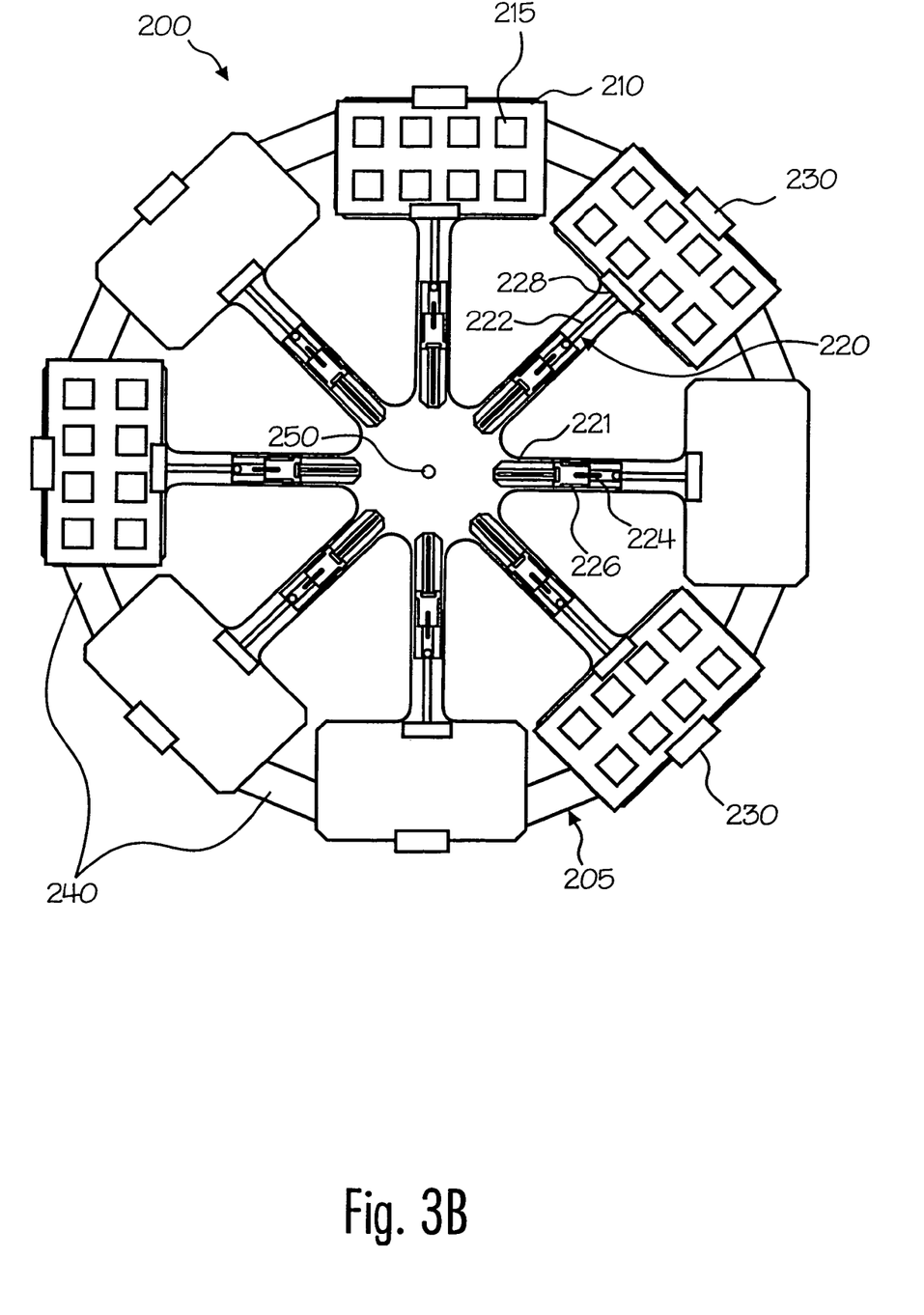

Turning to FIG. 3B, the target system 200 of the preferred embodiments includes means for rapid attachment and detachment of parts 215 to wheel 205. In one embodiment of the present invention, multiple parts 215 are loaded into a cassette fixture 210 (also referred to herein as part holding fixtures or device-holding fixtures) for spray coating. Multiple cassette fixtures 210 may then be temporarily fixed to wheel 205, preferably without the requirement of any unattached threaded fasteners or locking pins.

In one embodiment of the present invention, wheel 205 includes a spring-tensioned fixture clamping assembly 220 for rapid fixing and removal of parts 215 to/from wheel 205. Clamping assembly 220 may be any single device or combination of devices attachable to, and/or formed in, wheel 205 that is capable of achieving these functions.

Figure 3C:
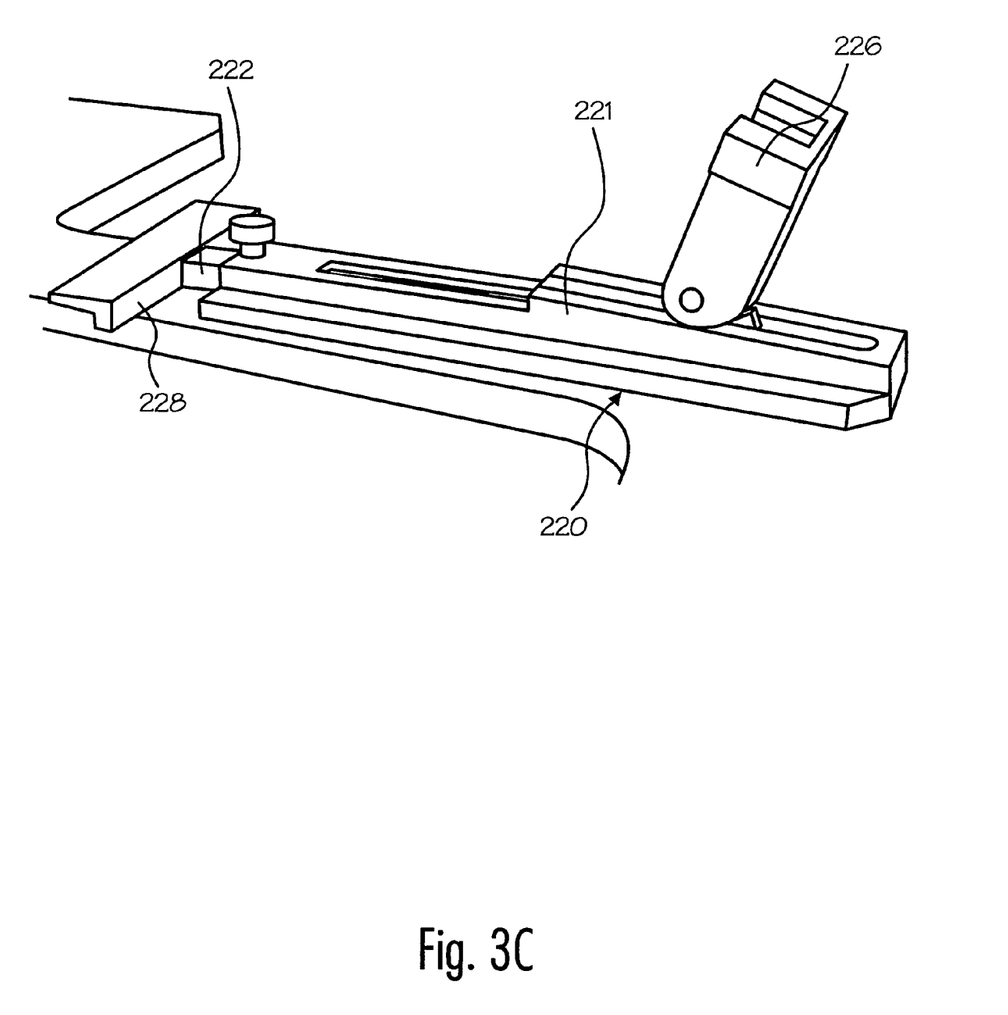
Figure 3D:
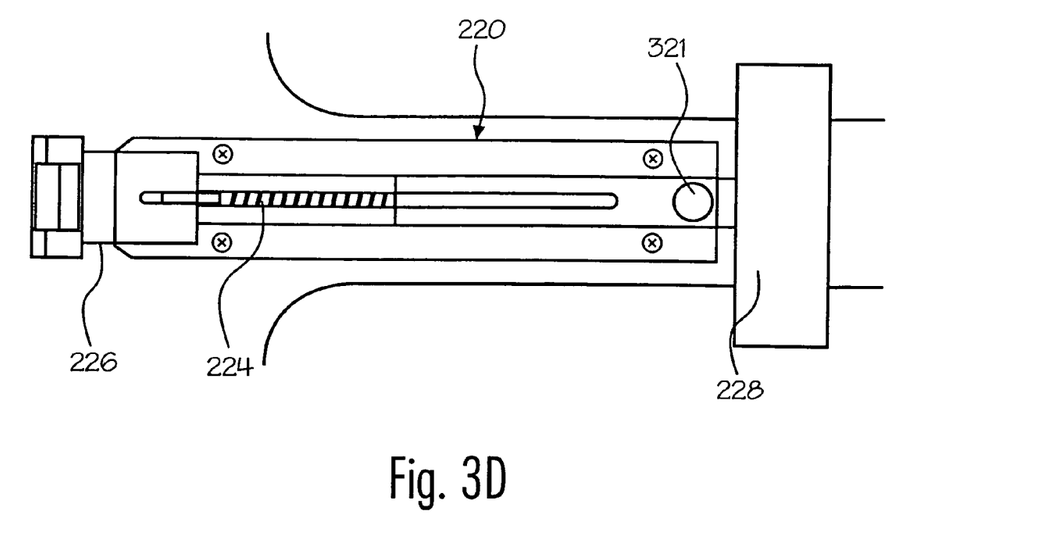
Figure 3E:
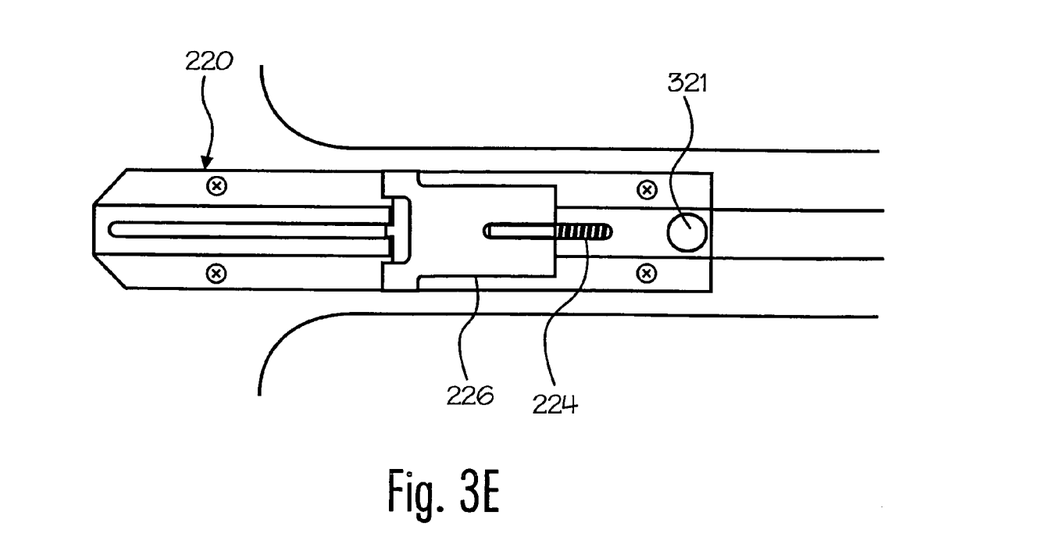

Referring also to FIGS. 3C-3E, in certain embodiments, clamping assembly 220 includes base 221, push rod 222, spring mechanism 224 and tension clamp 226. Assembly 220 may also include a clamp guide/mount 228 attached to a distal end of push rod 222.

Tension clamp 226 is preferably hingedly mounted to base 221 to have a first open position (FIG. 3C-D) and a second locked position (FIG. 3E). In the second locked position, tension clamp 226 asserts spring force on push rod 222 (using spring mechanism 224) to bias the push rod 222, and hence clamp guide/mount 228, radially outward toward a guide/mount 230 fixed to an outer periphery of wheel 205. When tension claim 226 is in the locked position, the spring tension provided by spring mechanism 224, applies pressure to hold a part 215 and/or part holding fixture 210 between clamp guide/mount 226 and fixed guide/mount 230. When tension clamp 226 is released into the first open position, push rod 222 and hence clamp guide/mount 228 is retracted radially inward to release any part 215 or part holding fixture 210 between clamp guide/mount 228 and fixed guide/mount 210. An optional thumbscrew 321 may be included in assembly 220 so that when tightened, it prevents push rod 222 from prematurely retracting until unloading parts and fixtures and/ or to minimize rod vibration during rotation of wheel 205.

Target system 200 may further include a temperature-monitoring ring so that device temperature can be monitored using infrared sensors. In a preferred embodiment for a flame spray process, a plurality of part holding fixtures 210 are loaded into respective spaces on wheel 205. Between each fixture is a raised inter-fixture guide 240 to assist in maintaining exact placement of fixtures 210 on wheel 205. Inter-fixture guides 240 are preferably configured to have surfaces that are flush with, or slightly raised above, surfaces of fixtures 210 mounted on wheel 205. Most preferably, guide 240 is configured with a slightly beveled overhand that assists in clamping fixtures 210 to wheel 205. The top surfaces of guides 240 and fixtures 210 form a continuous ring on the surface of wheel 205 for which temperatures of part surfaces, e.g., substrates of parts 215, can be accurately monitored using one or more infrared sensors. Process adjustments may be made during the deposition process based on the temperature (110; FIG. 3A).

System 200 further preferably includes a spray gun self-centering mechanism 205 to enable repeatable spray coating patterns. An important parameter of a spray coating process, and particularly a thermal spray process, is alignment of the spray gun or torch (160; FIG. 3A) to the wheel 205. Proper standoff distance, for example, may be critical to a successful coating operation.

In one embodiment, a gun self-centering mechanism 205 includes a hole located at an axial center point of wheel, a spring clip provided therein and a center spring held by the spring clip. Self-centering mechanism 205 may be used to verify that the torch is properly aligned before each coating operation commences.

Figure 4:
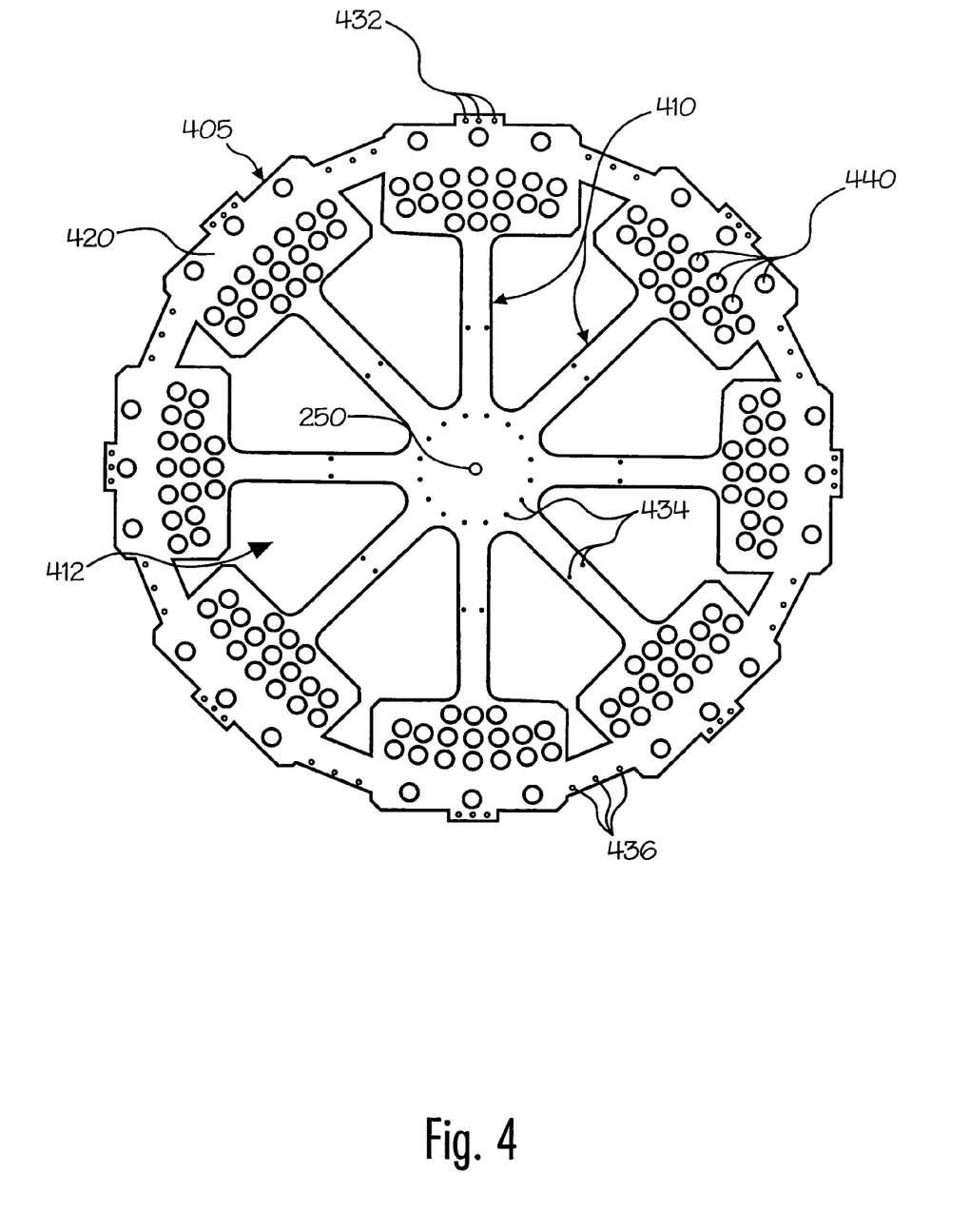
FIG. 4 illustrates a spray coating wheel in accordance with one preferred embodiment of the invention.

Turning to FIG. 4, an exemplary embodiment of a spray target wheel 405 includes a plurality of alternating radial arms 410 and radial openings 412. At an end of each radial arm 410 is a part or fixture backing surface 420. Radial arms 410 also preferably include a plurality of fixed guide mounting elements 432, clamping assembly mounting elements 434 and inter-fixture guide mounting elements 436. Mounting elements 432, 434 and 436 may be any configuration for mounting the respective items to wheel 205 including, by way of example, through holes, threaded holes, protruding pins, threaded fasteners and/or any combination thereof.

Radial openings 412 and voids 440 were selectively implemented into wheel 405 to reduce the overall weight of the wheel to improve handling and assembly of wheel 405. Moreover, reducing the mass of wheel 405 improves the overall target system 200 rotational and/or braking efficiency as well as the heat dissipation characteristics of wheel 405. To this end, mass-reducing holes are preferably implemented in as many areas of wheel 405 as possible without detracting from the structural integrity of wheel 405.

Wheel 405 is also designed with manufacturing ease in mind. The basic framework, as depicted by the example embodiment shown in FIG. 4, of wheel 405 may be machined from a flat stock material, in a preferred embodiment wheel 405 is machined from an aluminum plate material. Accordingly, support structures for holding device fixtures 210, etc., may be machined separately and attached to the main framework using screws or other types of fasteners. This is a significant improvement over conventional target wheel designs in which these structures were included in a one-piece design. Furthermore, these separate parts are easily replaceable when needed, as opposed to the time and expense incurred for requiring another entire wheel or fixing the same.

Wheel 405 also preferably includes a hole 450 for accommodating self-centering mechanism 250 (FIG. 3B). Wheel 405 is preferably designed to best accommodate device-holding fixtures 210 (FIG. 3B) rather than a design where device-holding fixtures were designed only after a wheel has been designed. For example, the outer diameter of the wheel is optimally selected to fit a selected number of device fixtures toward the outer radius of wheel 405. This design is preferably optimized for thermal management in a thermal spray coating process, e.g., facilitates a spray area large enough that coating application (or deposition) can be conducted without the need for forced cooling but small enough that device substrate temperatures may be kept uniform, that is, there is no significant difference in temperature between the inner spray arc and the outer spray arc.

Further, the configuration of wheel 405 helps minimize the areas of the wheel that are subject to over spray. And, together with keeping the spray areas of the wheel free from screws, bolts, or other small design features that may trap the sprayed material, leads to much simpler removal of unwanted over spray between coating runs. In the most preferred embodiments for a thermal spray process, wheel 405 surfaces and/or mounting support structures surfaces that are subject to the thermal spray process are hard anodized to protect them from the extreme environment of repetitive sprays.

Figure 5A:
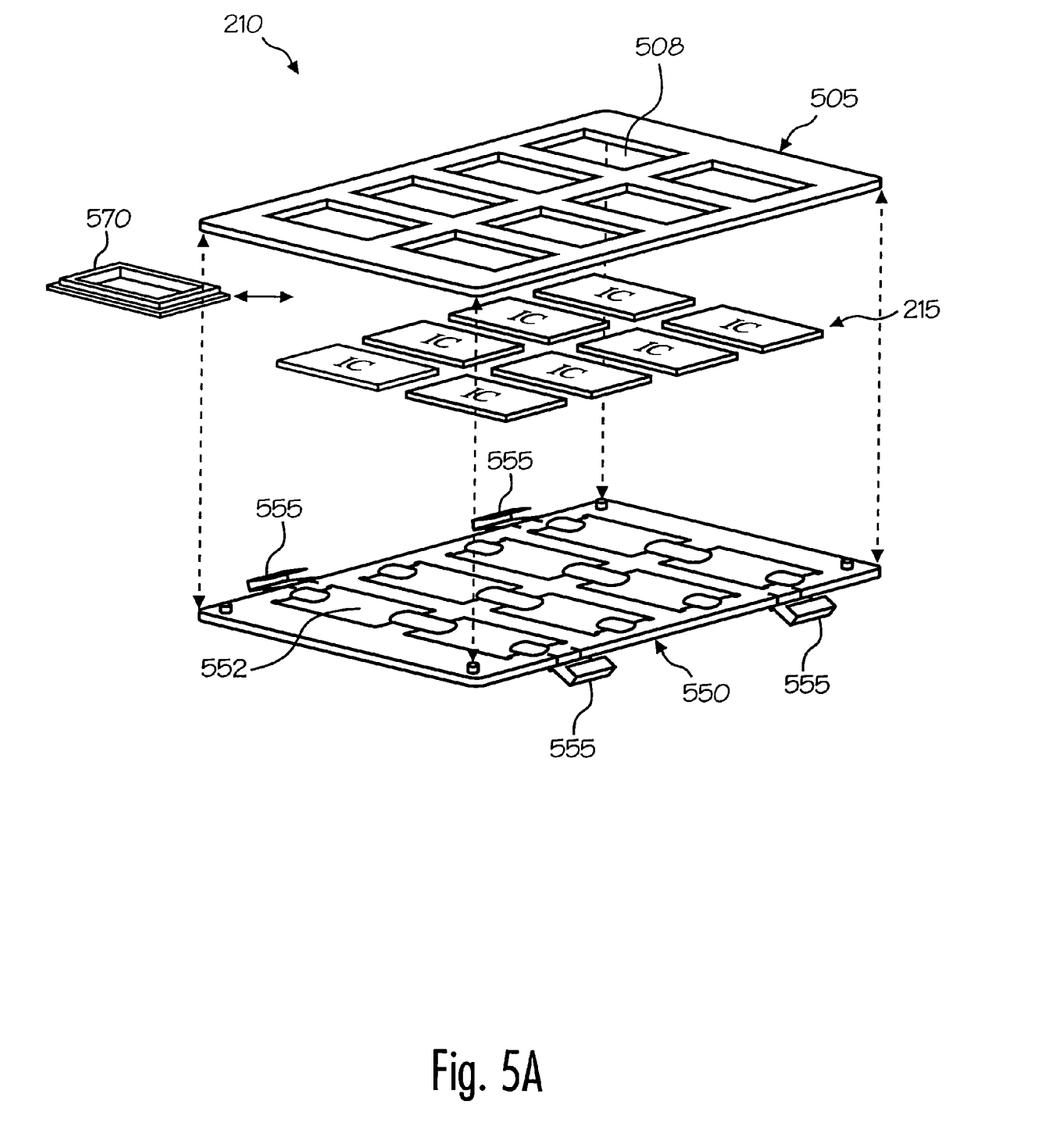
FIGS. 5A-5C illustrates a device-holding fixture for use in a spray coating process according to a first embodiment of the present invention.

Turning to FIG. 5A, a device-holding fixture 210 according to one embodiment of the present invention includes a mask plate and a receptacle plate 550. Mask plate 505 and receptacle plate 550 fit together to enclose one or more parts 215 to be coated. Mask 505 includes one or more windows 508 that serve to expose a surface of part 215 to a sprayed material when fixture 210 is mounted on a target system (e.g., 200; FIG. 3A) and sprayed. Receptacle plate 550 preferably includes one or more part alignment components 552 to assist in aligning part 215 at a window of mask plate 505 when part 215 is enclosed therein. Part alignment components 552 may be any holes, pins, depressions, ridges or other components that serve to guide and/or maintain parts 215 within fixture 210. In preferred embodiments of the invention, mask plate 505 is machined from brass and receptacle plate 550 is machined from plate aluminum.

Mask plate 505 and receptacle plate 550 may be temporarily held together for coating part 215 using any type of fastener 555 or fasteners which may facilitate at least temporary adherence of plate 505 to plate 550. In preferred embodiments fasteners 555 are of the type that do not require separate threaded fasteners such as clipping or snap type fasteners.

In the most preferred embodiments, fasteners 555 are one or more spring clips attached to one of either mask plate 505 or receptacle place 550 while the opposite plate preferably has corresponding lock grooves for receiving the spring clips 555 in a locked position. An alternative enclosure technique could include hinging mask plate 505 and receptacle plate 550 on one side and including a fastener 555 on one or more other sides.

Figure 5B:
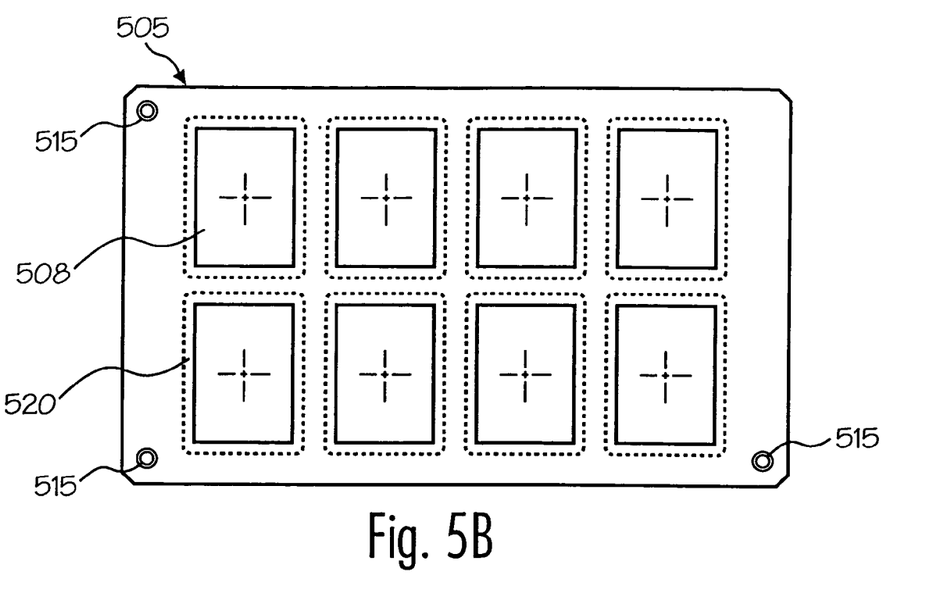

Referring to FIG. 5B, mask plate 505 preferably includes, and receptacle plate 550 has corresponding, alignment components 515, 516 such as ridges, pins and/or holes to assist in aligning mask plate 505 with receptacle plate 550.

Mask plate 505 and/or receptacle plate 550 may also include on an interior portion thereof, a sealing structure (not shown) for sealing edges of parts 215 that are to be coated from edges of parts 215 that are not desired to having coating applied. Seals may also facilitate gentle clamping of parts 215 between plates 505 and 550 and/or protect part 215 components from exposure to vapor or other environmental factors. These seals may be any component or combination of components to achieve these functions, for example, ridges machined around windows 508 and corresponding flexible material inserted therein. In a preferred embodiment, a closed cell, solvent resistant compliant material is added to the receptacle plate 550 underneath the devices 215. The compliant material is compressed onto the back of, for example, the product substrates when the mask plate 505 is attached, thereby forming a seal. The seal protects the ball pads, if any, or other device components located on the back of the substrate of parts 215 from heat and/or vapor that may form during processing as described below. Protection of ball pads from contamination reduces the chance of problems with attachment of solder balls during subsequent processing.

The inside edge of mask plate 505 preferably includes a window bevel and an undercut bottom 520. The window bevel helps the sprayed coating material reach the edges of parts 215 when a spray gun (e.g., torch 160 FIG. 1) is at an angle to a surface of parts 215. The undercut bottom 520 promotes the formation of a natural break between the spray on the mask plate 505 and the spray on the device 215. This enables the mask to easily lift off devices 215 after a spray coating has been applied. Undercut bottom 520 prevents bridging of sprayed coating material between the mask plate 505 and substrates of parts 215 which makes it easier to remove mask plate 505 and prevent pulling applied coating off of part 215.

Figure 5C:
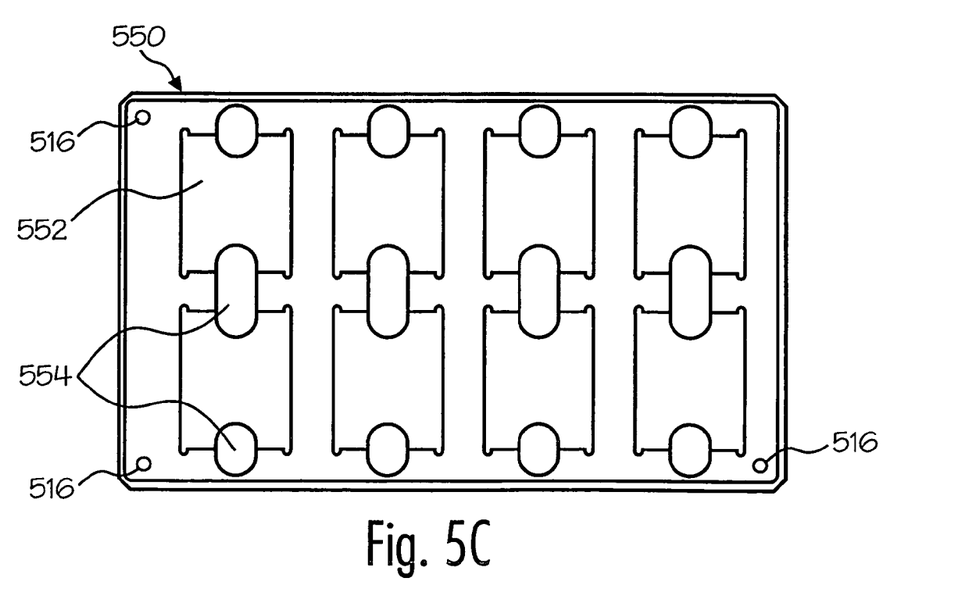

As shown in the example embodiment depicted in FIG. 5C, receptacle plate 550 may include one or more receptacles 552 for receiving a part and/or one or more corresponding part access depressions 554. Depressions 554 facilitate easier removal of parts 215 from respective receptacles 552.

Figure 6:
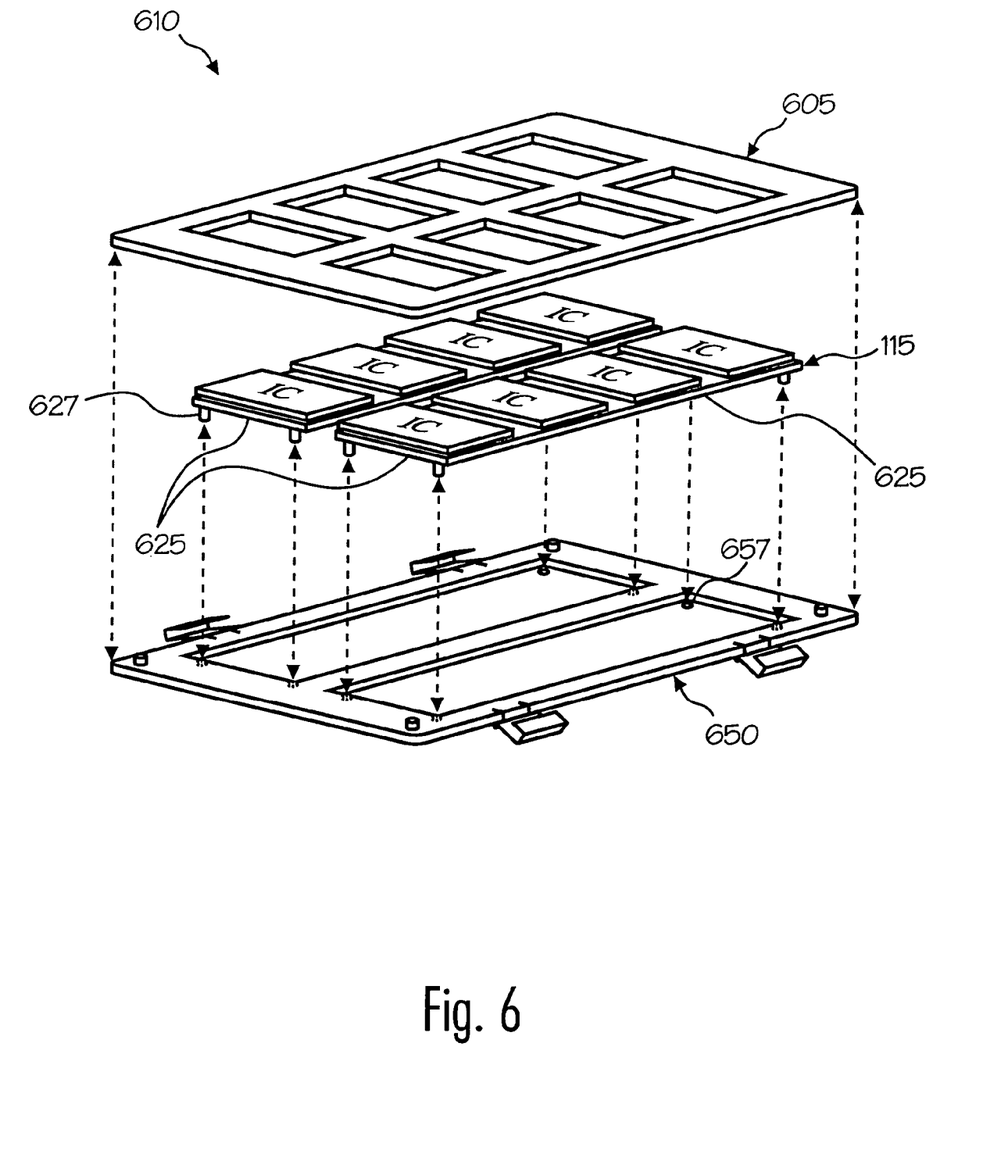
FIG. 6 illustrates a device-holding fixture for use in a spray coating process according to a second embodiment of the present invention.

Turning to FIG. 6, an alternate embodiment of part holding fixtures 610 includes mask plate 605 and receptacle plate 650. In this embodiment, mask plate 605 and receptacle plate 650 are configured to accommodate and enclose one or more device handling strips 625 which contain the parts to be coated 215. Device handling strips 625 may be used in other stages of device processing and are commonly used in the semiconductor device industry to reduce handling of parts 215 by hand between and during processing. However, device handling strips have not been previously used in a spray coating process or in association with more expensive semiconductor devices such a multichip modules.

In one embodiment, part holding fixture 605 is configured to accommodate two standard handling strips (which accommodate 5-6 devices each) between mask plate 605 and 650 using respective alignment components 627, 657 such as ridges, pins, holes and/or a combination thereof. Mask plate 605 and receptacle plate 650 are preferably held together using fasteners (not separately shown) similar to those previously discussed, for example, spring clips. The use of strips 625 in a thermal spray process reduces the need for operators to handle individual parts. This saves time and more importantly increases the yield of TRC coated devices since even experienced operators can easily damage wire-bonded parts when handled outside of strips 625. The accommodation of strips 625 in device-holding fixture 610 has significant advantages over fixtures designed to accommodate only individual parts.

Using part holding fixtures 210, 610 of the present invention, spray coatings may be applied to parts 215 in a rapid and efficient manner and preferably, with reduced handling of parts 215. Device-holding fixtures 210, 610 may also be used for applying a primer coating (e.g., such as discussed by Heffner et al.) in preparation for application of a thermal spray. Application of the primer coating in one embodiment of the invention is performed using a system other than that shown and described in reference to FIG. 1. In one embodiment, an automated primer-coating machine with conveyor is used to apply the primer to the surface of device 215.

Figure 7A:
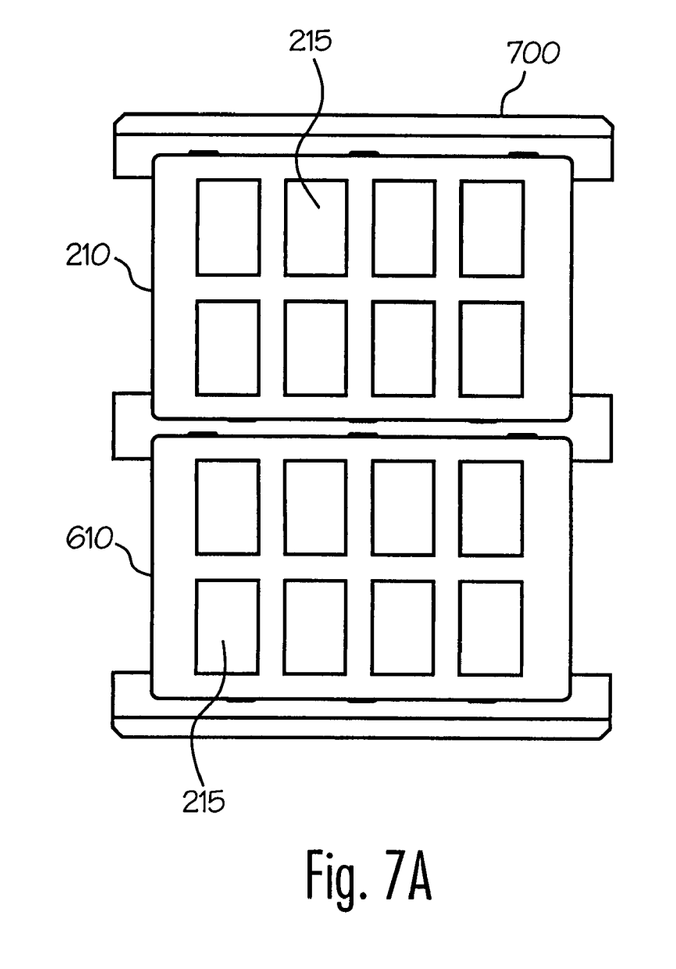
FIGS. 7A-7B illustrate a device-holding fixture processing tray for use in a spray coating process according to an embodiment of the present invention.
Figure 7B:
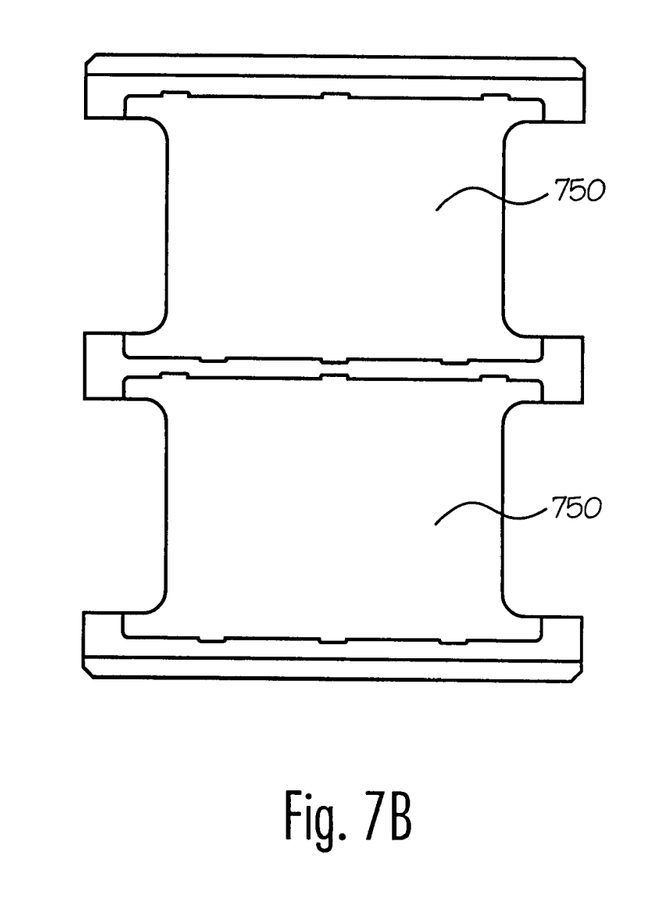

To this end, fixtures 210, 610 may be individually placed on the conveyor for priming. However, turning to FIGS. 7A and 7b, in another embodiment of the present invention, a pallet 700 is designed to accommodate multiple device-holding fixtures 210, 610 for application of a primer coating. Pallet 700 is preferably made of an aluminum material and configured to fit the conveyor of an existing automated coating machine such as a Nordson Easycoat machine. However, using pallet 700 two part holding fixtures may be accommodated for each run through the machine for automated application of the primer coating. Pallet 700 is dimensioned and configured to ride on the machine's conveyor into the automated priming cell. The setup time required to program the automated primer machine may greatly reduced with pallet 700 and fixtures 210, 610 because parts 215 are regularly spaced at predetermined intervals and oriented at square angles to the motion axes of the primer spray nozzle.

In preferred embodiments, device-holding fixtures 210, 610 are substantially rectangular in shape with devices 215 placed at regular intervals across the fixture. However the shape of fixtures 210 and 610 and the configuration of windows therein is not critical. The shape and layout of fixtures 210, 610 may be modified as suitably necessary. Notwithstanding, the predetermined shape, size and window configuration of fixtures 210 and 610 and in determining predictable results. In any event, according to preferred embodiments of the invention, the same device-holding fixtures 210, 610 are configured so that they may be used for both the application of a primer in an automated primer machine and the application of the thermal spray coating.

Certain parts 215 may include a metallic ring of material for sealing an integrated circuit device. Such devices, for example, certain flatpack devices, often require coating without contaminating the devices in the areas outside of the seal ring or the top surface of the seal ring. Coating material that contaminates these surfaces could interfere with electrical connections or next step sealing operations.

For parts 215 that include seal rings, fixtures 210, 610 are adapted to conform to the same general shape and thickness of the parts 215 and may include inserts (570; FIG. 5A) that fit over the seal ring of each device 215. Insert 570 serves as a sleeve to further define the mask window for coating device 215. Insert 570 preferably includes a thin lip that fits tightly inside the seal ring. Window 508 is dimensioned to permit a loose fit with insert 570 such that insert 570 has freedom of movement to accommodate typical variations found in ring placement when constructing part 215. This allows for the same fixture design to accommodate the typical variations found in various types of devices 215 with a wide size tolerance and without having any impact on a defined spray area.

Inserts 570 are preferably made of an aluminum material and configured with a lip that fits inside the device seal ring to prevent unwanted build-up of thermal spray material on the walls of the seal ring. The lip of the insert may also serve to lock the position of the insert on top of the seal ring. The inserts also preferably include compliant material, e.g., similar to the material for seals discussed above, on the surfaces of the insert that contact the mask, receptacle plate and/or device. The compliant material promotes the application of gentle clamping pressure between the mask plate 505, 605 and receptacle plate 550, 650 on the device 215 and the insert. Without the compliant material, the tolerance variation typical in, for example, ceramic devices may result in loosely clamped assemblies that are subject to movement during the thermal spray process. The compliant material on the insert also facilities a seal around the seal ring of device 215 to protect the sides, bottom and leads from contamination by sprayed coating material such as primer or thermal spray coating.

Figure 8:
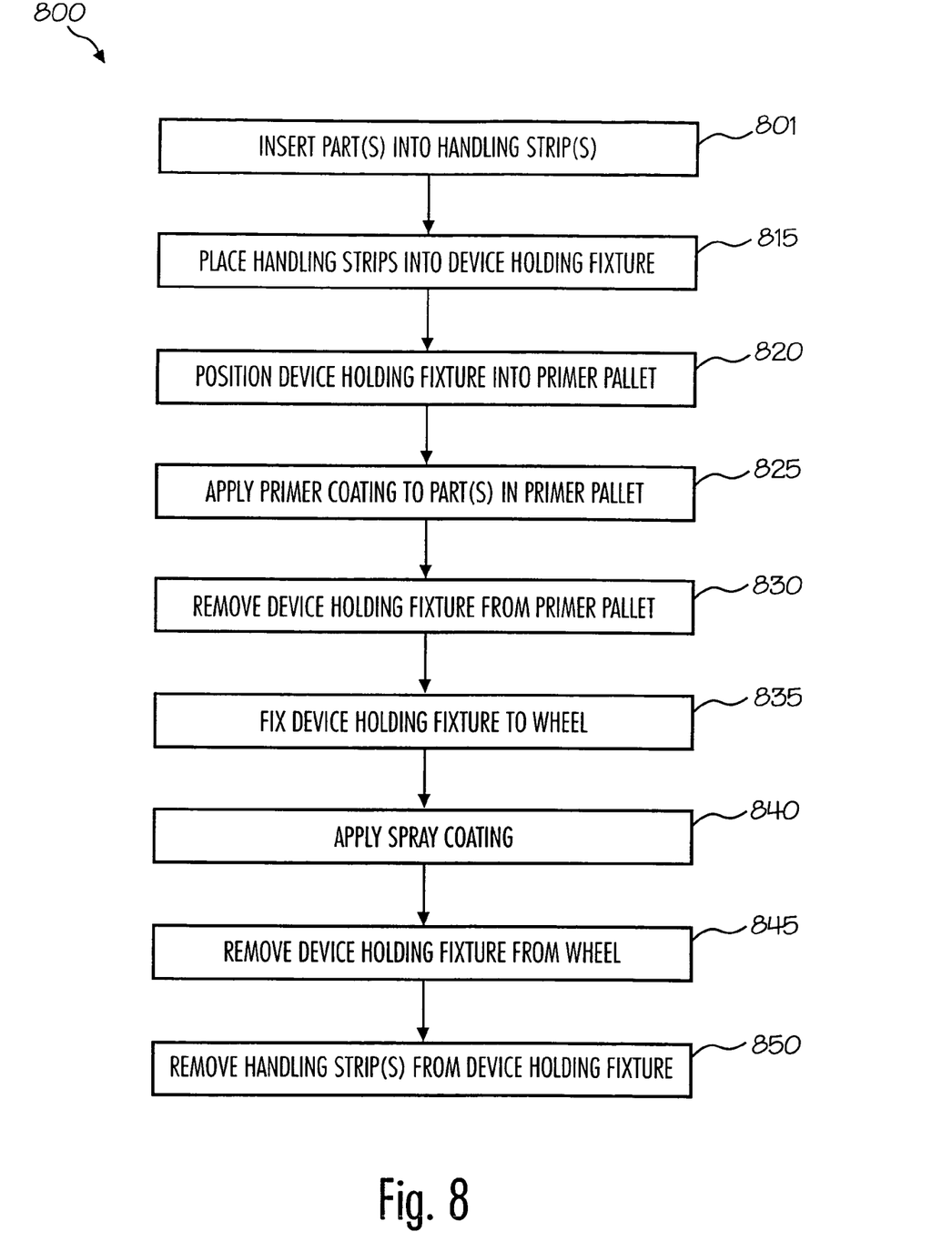
FIG. 8 is a flow diagram illustrating a method of applying a spray coating according to an embodiment of the invention.

Turning to FIG. 8, a method 800 for applying a spray coating to parts using the apparatuses and systems of the present invention includes placing 815 the part or parts desired to be coated into a device-holding fixture, fixing 835 the device-holding fixture to a target spray wheel, applying 840 a spray coating to the device-holding fixture fixed on the wheel; removing 845 the part holding fixture from the wheel; and, if appropriate, removing 850 the parts from the part holding fixture. In an optional embodiment, the method includes corresponding steps for the use of part handling strips (e.g., actions 801 and 850).

Moreover, if the spray coating is a thermally sprayed material, after placing 815 the parts into the device-holding fixture, method 800 may further include, positioning 820 the device-holding fixture into an accommodating pallet in an automated primer coating machine, applying 825 a primer coating to parts in the primer pallet and removing 830 the device-holding fixture from the primer pallet. After coating parts in a device holding fixture with a primer coating, it is preferable to clean or replace the mask portion of the device-holding fixture to before proceeding to apply a thermal spray coating.

Placing 815 parts into a device-holding fixture may include placing an insert around a part and enclosing the part and respective insert between two halves of the device-holding fixture. Additional actions such as plasma cleaning steps and/or drying may be included in method 800 although not separately discussed herein.

Unless contrary to physical possibility, the inventor envisions the methods and systems described herein: (i) may be performed in any sequence and/or combination; and (ii) the components of respective embodiments combined in any manner.

Although there have been described preferred embodiments of this novel invention, many variations and modifications are possible and the embodiments described herein are not limited by the specific disclosure above, but rather should be limited only by the scope of the appended claims.

The invention claimed is:

1. A method of applying a tamper resistant coating comprising:
   placing a plurality of parts to be coated into a device-holding fixture;
   positioning the device-holding fixture into a primer pallet designed to accommodate a plurality of device-holding fixtures;
   applying a primer coating to the primer pallet;
   removing the device-holding fixture from the primer pallet;
   fixing the device-holding fixture to a thermal spray target wheel having a plurality of radial arms and spaces therebetween, each of the plurality of radial arms having a distal end, the plurality of radial arms being connected to each other at their respective distal ends;
   applying a thermal spray coating; and
   removing the device-holding fixture from the wheel.

2. The method of claim 1 wherein placing the one or more parts to be coated into the device-holding fixture comprises:
   inserting the one or more parts to be coated into a handling strip; and
   placing the handling strip between a mask plate and a receptacle plate of the device-holding fixture.

3. The method of claim 1, further comprising cleaning a mask portion of the device-holding fixture before applying the thermal spray coating.

4. The method of claim 1, further comprising replacing a mask portion of the device-holding fixture before applying the thermal spray coating.

* * * * *